United States Patent [19]
Sato et al.

[11] Patent Number: 6,110,751
[45] Date of Patent: Aug. 29, 2000

[54] TUNNEL JUNCTION STRUCTURE AND ITS MANUFACTURE AND MAGNETIC SENSOR

[75] Inventors: Masashige Sato; Hideyuki Kikuchi; Kazuo Kobayashi, all of Kawasaki, Japan

[73] Assignee: Fujitsu Limited, Kawasaki, Japan

[21] Appl. No.: 09/057,194

[22] Filed: Apr. 8, 1998

[30] Foreign Application Priority Data

Jan. 10, 1997 [JP] Japan ................................ 9-268998

[51] Int. Cl.$^7$ ................................ H01L 21/00; G11B 5/39
[52] U.S. Cl. ................................ 438/3; 257/421; 360/113; 365/158
[58] Field of Search ................................ 438/3, 800; 257/421; 360/113, 126; 365/158

[56] References Cited

U.S. PATENT DOCUMENTS 5,862,022  1/1999  Noguchi et al. .................. 360/113
5,986,858  11/1999  Sato et al. ........................ 360/113

*Primary Examiner*—Charles Bowers
*Assistant Examiner*—Craig Thompson
*Attorney, Agent, or Firm*—Greer, Burns & Crain, Ltd.

[57] ABSTRACT

A tunnel junction structure is provided. A first magnetic layer is formed on a support substrate. A tunnel insulating layer is disposed on the first magnetic layer, the tunnel insulating layer containing a metal element as a constituent. A second magnetic layer is disposed on the tunnel insulating layer. A diffusion preventing layer disposed between the first magnetic layer and the tunnel insulating layer. The diffusion preventing layer suppresses mutual diffusion between metal atoms in the first magnetic layer and metal atoms in the tunnel insulating layer. The tunnel insulating layer and the diffusion preventing layer each have a thickness allowing tunnel current to flow between the first and second magnetic layers.

14 Claims, 7 Drawing Sheets

TUNNEL JUNCTION STRUCTURE AND ITS MANUFACTURE AND MAGNETIC SENSOR

This application is based on Japanese Patent Application No. Hei 9-268998 filed on Oct. 1, 1997, the entire contents of which are incorporated herein by reference.

BACKGROUND OF THE INVENTION a) Field of the Invention

The present invention relates to a tunnel junction structure, its manufacture method, and a magnetic sensor having such a tunnel junction structure.

b) Description of the Related Art

In a laminated structure of a metal layer, an insulating layer, and a metal layer stacked in this order, tunnel current flows as voltage is applied across the metal layers on both sides, if the thickness of the insulating layer is sufficiently thin (several angstroms to several tens angstroms). Such a junction is called a tunnel junction. A metal oxide film is generally used as the insulating film. For example, the surface layer of an aluminium layer is oxidized through natural oxidation, plasma oxidation, thermal oxidation or the like to form a thin film of aluminum oxide. By controlling the oxidation conditions, the thickness of the aluminum oxide thin film can be made several angstroms to several tens angstroms.

A tunnel junction having the metal layers on both sides made of ferromagnetic material, is called a ferromagnetic tunnel junction. A tunneling probability (tunnel resistance) of the ferromagnetic tunnel junction depends on the magnetization states of the magnetic layers on both sides. Therefore, if the magnetization states of the magnetic layers are changed by applying an external magnetic field, the tunnel resistance can be controlled. In other words, a change in the external magnetic field can be detected from a change in the tunnel resistance.

A tunnel resistance R is given by the following equation:

$$R = Rs + (\tfrac{1}{2})\Delta R(1 - \cos\theta) \quad (1)$$

where $\theta$ is an angle between magnetization directions in the magnetic layers on both sides. Rs is a tunnel resistance at the angle $\theta$ of 0°, i.e., when the magnetization directions in both the magnetic layers are parallel to each other. $\Delta R$ is a difference between a tunnel resistance when the magnetization directions in both the magnetic layers are parallel to each other and a tunnel resistance when they are reversed-parallel to each other.

As seen from the equation (1), the tunnel resistance R becomes minimum when the magnetization directions in both the magnetic layers are parallel to each other, and becomes maximum when they are reversed-parallel to each other. This results from polarization of spins of electrons in the ferromagnetic material. Generally, an electron takes either an up-spin state or a down-spin state. An electron in the up-spin state is called an up-spin electron, whereas an electron in the down-spin state is called a down-spin electron.

In non-magnetic material, generally the number of up-spin electrons is equal to the number of down-spin electrons. Therefore, there is no magnetization in the non-magnetic material as a whole. In contrast, in ferromagnetic material, the numbers of up-spin and down-spin electrons are different. Therefore, there is up or down-direction magnetization in the ferromagnetic material as a whole.

It is known that each electron is moved by the tunneling phenomenon, while retaining its spin state. In this case, although an electron can be tunneled if there is an empty energy level corresponding to the spin state of the electron to be tunneled in the destination magnetic layer, it cannot be tunneled if there is no such an empty energy level.

A change rate $\Delta R/Rs$ of the tunnel resistance is given by a product of a polarization factor of an electron source and that of a destination empty energy level, as in the following:

$$\Delta R/Rs = 2P_1 P_2 / (1 - P_1 P_2) \quad (2)$$

where $P_1$ is a spin polarization factor of an electron of an electron source, and $P_2$ is a spin polarization factor of an empty energy level of a tunnel destination magnetic layer. $P_1$ and $P_2$ are expressed by:

$$P_1, P_2 = 2(\text{Nup} - \text{Ndown})/(\text{Nup} + \text{Ndown}) \quad (3)$$

where Nup is the number of up-spin electrons or the number of energy levels for an up-spin electron, and Ndown is the number of down-spin electrons or the number of energy levels for a down-spin electron.

The polarization factors $P_1$ and $P_2$ change depending upon the kind of ferromagnetic material, and some material takes a polarization factor of near 50%. In such a case, a resistance change rate of several tens % larger than a resistance change rate of the anisotropic magnetoresistive effects and the giant magnetoresistive effects can be expected.

A metal oxide is generally used as an insulating film of a ferromagnetic tunnel junction structure. This metal oxide is formed by depositing a metal layer and oxidizing the surface thereof through natural oxidation, plasma oxidation, thermal oxidation or the like. This insulating film forming method, however, may oxide only the surface layer of the metal layer and leave an unoxidized metal layer in the deepest region.

The unoxidized metal layer may form solid solution by reacting with the magnetic layer at a later high temperature process. In this case, a four-layer structure of magnetic layer/solid solution layer/insulating layer/magnetic layer or a five-layer structure of magnetic layer/solid solution layer/metal layer/insulating layer/magnetic layer is formed. Since solid solution is non-magnetic, electrons in the solid solution are not spin-polarized. Therefore, the polarization factor of an electron tunneling between the magnetic layers attenuates in the solid solution so that the resistance change rate given by the equation (2) lowers.

SUMMARY OF THE INVENTION

It is an object of the present invention to provide a tunnel junction structure having a large resistance change rate and capable of suppressing the formation of a non-magnetic layer at the interfaces between the magnetic layers and an insulating layer of a tunnel junction, and to provide its manufacture method and a magnetic sensor using such a tunnel junction structure.

It is another object of the present invention to provide a tunnel junction structure having good electrical characteristics and being capable of suppressing interaction between the metal layer and insulating layer of a tunnel junction.

According to one aspect of the present invention, there is provided a tunnel junction structure, comprising: a first magnetic layer formed over a support substrate; a tunnel insulating layer disposed over the first magnetic layer, the tunnel insulating layer containing a metal element as a constituent; a second magnetic layer disposed over the tunnel insulating layer; and a diffusion preventing layer disposed between the first magnetic layer and the tunnel insulating layer and made of material which suppresses mutual diffusion between metal atoms in the first magnetic layer and metal atoms in the tunnel insulating layer, wherein the tunnel insulating layer and the diffusion preventing layer each have a thickness allowing tunnel current to flow between the first and second magnetic layers.

According to another aspect of the present invention, there is provided a method of manufacturing a tunnel junction structure, comprising the steps of: depositing a first magnetic layer on a surface of a base substrate; forming a diffusion preventing layer having a thickness sufficient for electrons to tunnel therethrough, by oxidizing or nitriding a surface of the first magnetic layer; depositing a metal layer on a surface of the diffusion preventing layer, the metal layer being made of metal which can be changed to insulating material through oxidization or nitridation; forming a tunnel insulating layer by oxidizing or nitriding at least a surface layer of the metal layer; and depositing a second magnetic layer on a surface of the tunnel insulating layer.

Since the diffusion preventing layer is disposed, mutual diffusion between metal atoms of the first magnetic layer and metal atoms of the tunnel insulating layer can be suppressed, and the formation of solid solution of both the atoms can be prevented. If solid solution is formed between the magnetic layer and tunnel insulating layer, the spin polarization factor of electrons which tunnel between the magnetic layers lowers. Since the formation of solid solution can be prevented, it is possible to prevent the electron spin polarization from being lowered and to obtain a large tunnel resistance change rate.

According to another aspect of the present invention, there is provided a tunnel junction structure having a first metal layer, a tunnel insulating layer and a second metal layer laminated in this order, the tunnel junction structure comprising: a diffusion preventing layer disposed between at least one of the first and second metal layers and the tunnel insulating layer, the diffusion preventing layer preventing mutual diffusion between metal atoms of the at-least-one of the first and second metal layers and atoms constituting the tunnel insulating layer.

Since mutual diffusion between metal atoms of the metal layer and metal atoms of the tunnel insulating layer can be prevented, expected electrical characteristics can be retained even at a high temperature.

According to another aspect of the present invention, there is provided a magnetic sensor comprising: a first magnetic layer formed on a support substrate; a tunnel insulating layer disposed on the first magnetic layer, the tunnel insulating layer containing a metal element as a constituent; a second magnetic layer disposed on the tunnel insulating layer; a diffusion preventing layer disposed between the first magnetic layer and the tunnel insulating layer and made of material which suppresses mutual diffusion between metal atoms in the first magnetic layer and metal atoms in the tunnel insulating layer; and detecting means for detecting a change in a tunnel resistance between the first and second magnetic layers, wherein the tunnel insulating layer and the diffusion preventing layer each have a thickness allowing tunnel current to flow between the first and second magnetic layers.

Mutual diffusion between metal atoms of the first magnetic layer and metal atoms of the tunnel insulating layer can be suppressed, and the formation of solid solution of both the atoms can be prevented. Since the formation of solid solution can be prevented, it is possible to prevent the spin polarization of electrons tunneling between the magnetic layers from being lowered, prevent the tunnel resistance change rate from being lowered, and obtain a magnetic sensor of high sensitivity.

As above, a ferromagnetic tunnel junction structure highly resistant to heat can be realized by suppressing mutual diffusion of metal elements constituting the magnetic layers and a metal element constituting the tunnel insulating layer. A magnetic sensor and magnetic head of high heat resistance can be manufactured by using such ferromagnetic tunnel junction structures.

DETAILED DESCRIPTION OF THE PREFERRED EMBODIMENTS

Prior to describing the embodiments of the invention, experiments conducted for the evaluation of reaction between Co and Al at the interface between a Co layer and an Al layer of a two-layer structure, will be described.

Figure 8A:
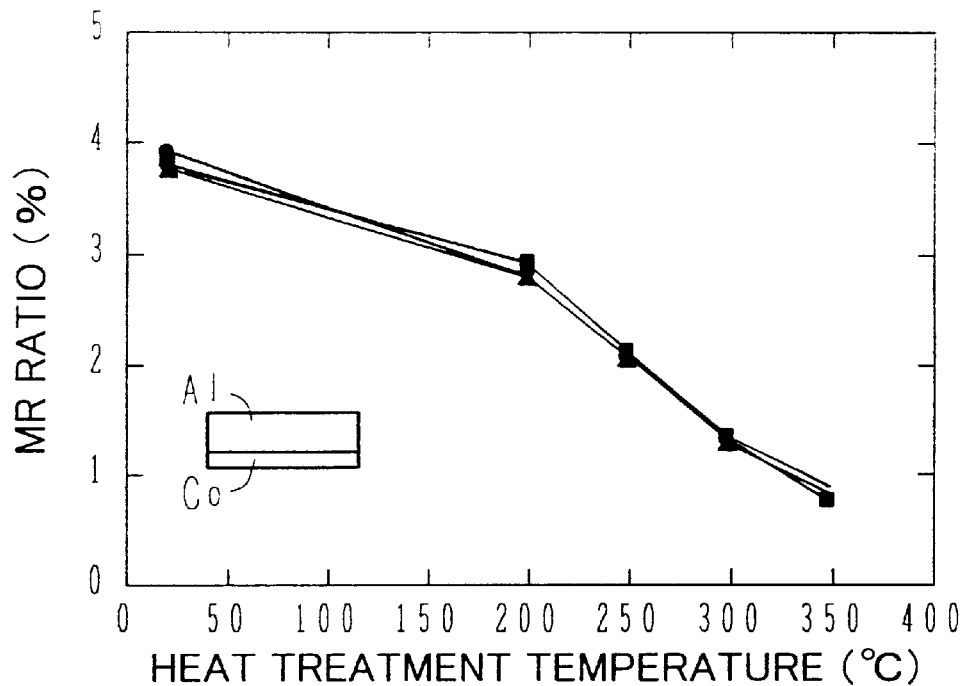
FIGS. 8A and 8B are graphs showing a heat treatment dependency on saturated magnetization of a Co/Al laminated structure and a Co/CoO/Al laminated structure, respectively.

FIG. 8A is a graph showing saturated magnetization of Co layers as a function of a heat treatment temperature, the saturated magnetization being measured after each two-layer structure of the Co layer of 3.0 $\mu$m thick and an Al layer of 10 nm thick formed on the Co layer was thermally processed. The abscissa represents a heat treatment temperature in the unit of ° C., and the ordinate represents saturated magnetization in the unit of emu. A plurality of samples were formed under the same manufacture conditions, and saturated magnetization of each sample was measured and plotted. If a heat treatment is performed at a temperature of 200° C. or higher, the saturated magnetization lowered rapidly. This may be ascribed to solid solution formed by mutual diffusion of Co and Al at the interface between the Co and Al layers during heat treatment.

Figure 8B:
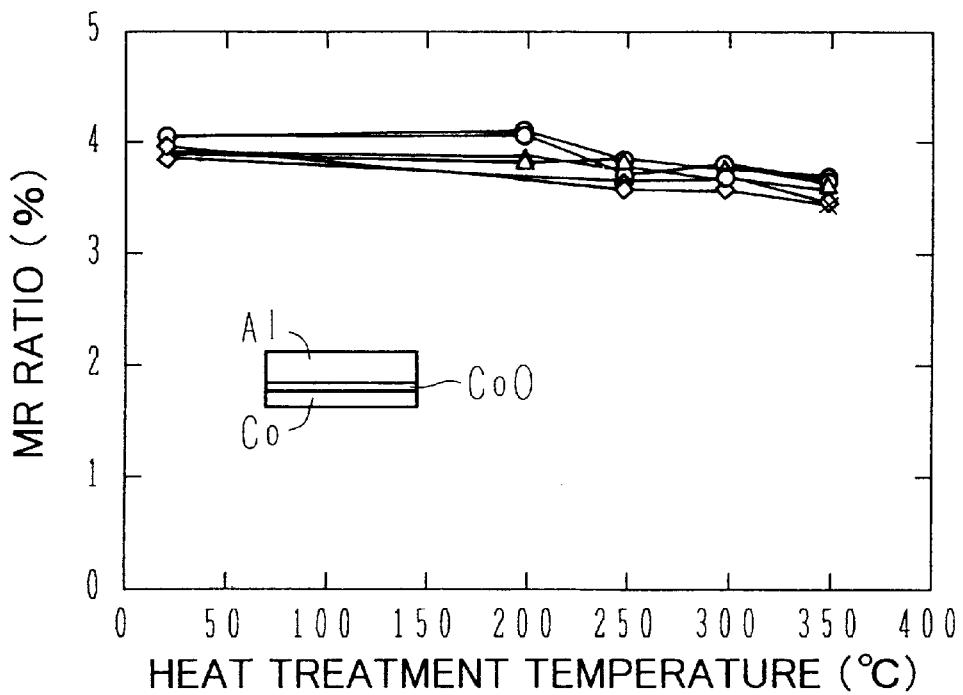

FIG. 8B is a graph showing saturated magnetization as a function of a heat treatment temperature, the saturated magnetization being measured after each sample structure was thermally processed, and the structure being formed by depositing a Co layer, by exposing it in the atmosphere for 2 hours to form a natural oxide film (CoO layer) on the surface of the Co layer, and thereafter by depositing an Al layer. A plurality of samples were formed under the same manufacture conditions, and saturated magnetization of each sample was measured and plotted. The thicknesses of the Co and Al layers are the same as those shown in FIG. 8A. Even if a heat treatment was performed at 350° C., saturated magnetization lowered scarcely. This may be ascribed to the CoO layer formed at the interface between the Co and Al layers which CoO layer functions as a diffusion preventing layer.

Next, an embodiment of the invention will be described with reference to FIGS. 1A to 3.

Figure 1A:
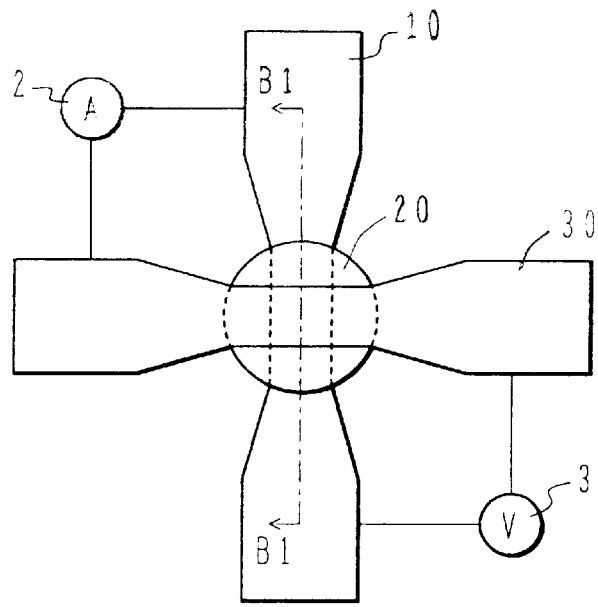
FIGS. 1A and 1B are a plan view and a cross sectional view showing a ferromagnetic tunnel junction structure according to an embodiment of the invention.

FIG. 1A is a plan view of a ferromagnetic tunnel junction structure according to an embodiment of the invention. On the surface of an Si substrate, a lower magnetic layer 10 extending in the vertical direction in FIG. 1A is formed. On generally the central area of the lower magnetic layer 10, an intermediate layer 20 including a tunnel insulating layer is formed covering the lower magnetic layer 10. An upper magnetic layer 30 is formed extending in the horizontal direction in FIG. 1A and crossing the lower magnetic layer 10 in the area formed with the intermediate layer 20. For example, each layer is formed through sputtering by using a metal mask having an opening conformal to the shape of each layer.

A voltage meter 3 and a current meter 2 are connected between the lower and upper magnetic layers 10 and 30. A tunnel resistance can be calculated from measured voltage and current.

Figure 1B:
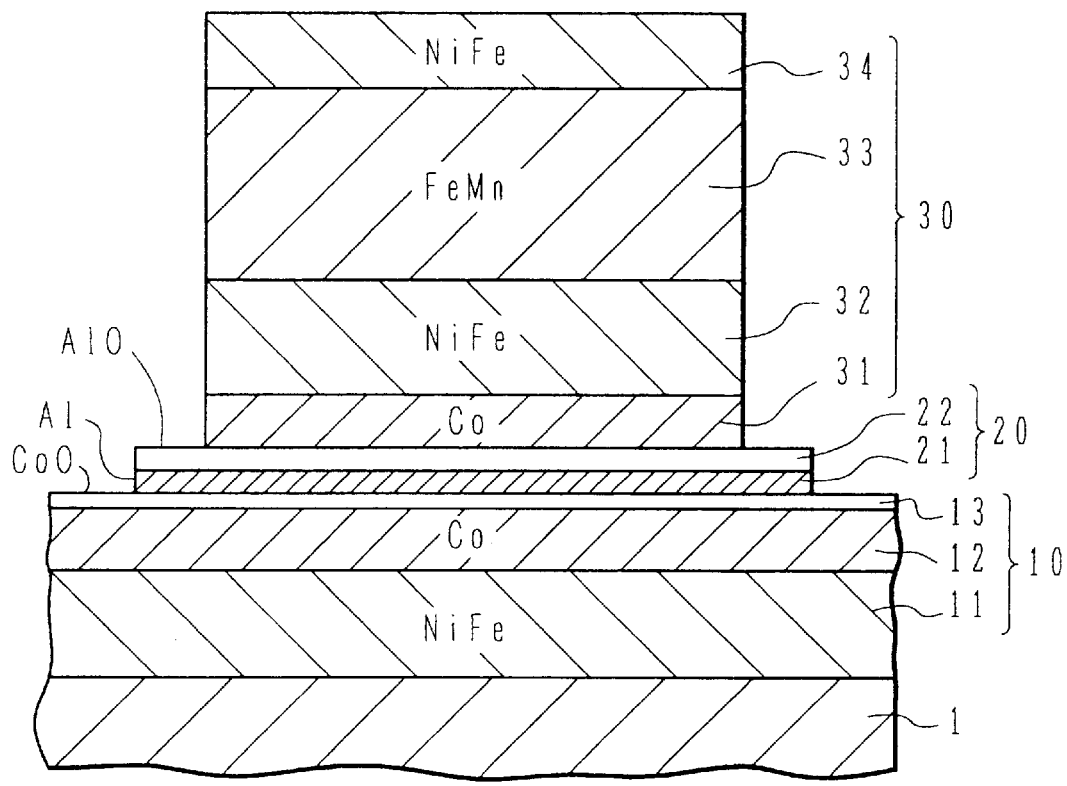

FIG. 1B is a cross sectional view taken along one-dot chain line B1—B1 shown in FIG. 1A. The lower magnetic layer 10 formed on the surface of the Si substrate 1 has a laminated structure made of a NiFe layer 11, a Co layer 12 and a CoO layer 13. In this specification, if a composition ratio of each compound is not explicitly given, the composition ratio is not limited only to one combination. For example, the composition ratio of CoO is not limited only to Co/O=1:1. The NiFe layer 11 and Co layer 12 are deposited in a magnetic field parallel to the substrate plane and perpendicular to the extending direction of the lower magnetic layer 10. The NiFe layer 11 and Co layer 12 are therefore magnetized in the direction perpendicular to the drawing sheet of FIG. 1B. The thicknesses of the NiFe layer 11 and Co layer 12 are, for example, 17 nm and 3.3 nm, respectively. The CoO layer 13 is a natural oxide film formed by exposing the Co layer 12 in the atmosphere for one hour. Plasma oxidation, thermal oxidation or the like may also be used.

The intermediate layer 20 formed on the lower magnetic layer 10 has a laminated structure made of an Al layer 21 and an AlO tunnel insulating layer 22. For example, the intermediate layer 20 is formed by depositing an Al layer of 1.3 nm thick and exposing it in the atmosphere for 500 hours to oxidize the surface layer thereof naturally. Plasma oxidation, thermal oxidation or the like may also be used.

The upper magnetic layer 30 formed on the intermediate layer 20 has a laminated structure made of a Co layer 31 of 3.3 nm thick, a NiFe layer of 17 nm thick, a FeMn layer 33 of 45 nm thick, and a NiFe layer 34 of 8 nm thick. Each layer constituting the upper magnetic layer 30 is deposited in a magnetic field parallel to the substrate plane and perpendicular to the extending direction of the upper magnetic layer 30. Each layer constituting the upper magnetic layer 30 is therefore magnetized in the horizontal direction in FIG. 1B.

The polarization factor of Co is larger than that of NiFe. Therefore, by inserting the Co layer 12 between the NiFe layer 11 and intermediate layer 20 and by inserting the Co layer 31 between the NiFe layer 32 and intermediate layer 20, the change rate $\Delta R/Rs$ of a tunnel resistance given by the equation (2) can be made large. The NiFe layer 34 on the FeMn layer 33 prevents the oxidation of the FeMn layer 33.

The CoO layer 13 prevents the mutual diffusion between the Al layer 21 and lower Co layer 12 and the formation of solid solution of Al and Co. Since the non-magnetic Al layer 21 is inserted between the lower Co layer 12 and upper Co layer 31, it is feared that the spin polarization factor of an electron tunneling between the upper and lower Co layers 12 and 31 is lowered and hence the tunnel resistance change rate lowers. However, the total thickness of the Al layer 21 and AlO layer 22 is very thin as about 1.3 nm, so that the spin polarization factor of an electron is lowered only a little. It is therefore supposed that there is no problem in practical use.

If the deposited Al layer is oxidized over the whole thickness, the intermediate layer 20 can be structured only by the AlO layer 22. In this case, the spin polarization of an electron is not lowered.

NiFe is ferromagnetic material, and FeMn is antiferromagnetic material. The FeMn layer 33 and NiFe layer 32 of the upper magnetic layer 30 perform magnetic exchange interaction, so that the magnetization direction of the ferromagnetic NiFe layer 32 is fixed irrespective of an external magnetic field. Similarly, the magnetization direction of the Co layer 31 of the upper magnetic layer 30 is fixed. In contrast, the magnetization directions of the NiFe layer 11 and Co layer 12 of the lower magnetic layer 10 change with an external magnetic field.

Therefore, as a magnetic field is externally applied to the lower magnetic layer 10, a relative magnetization angle of the lower Co layer 12 and upper Co layer 31 changes. As the relative magnetization angle changes, the tunnel resistance changes as understood from the equation (1). A change in the external magnetic field can therefore be detected by measuring the tunnel resistance with the voltage meter 3 and current meter 2.

Figure 2:
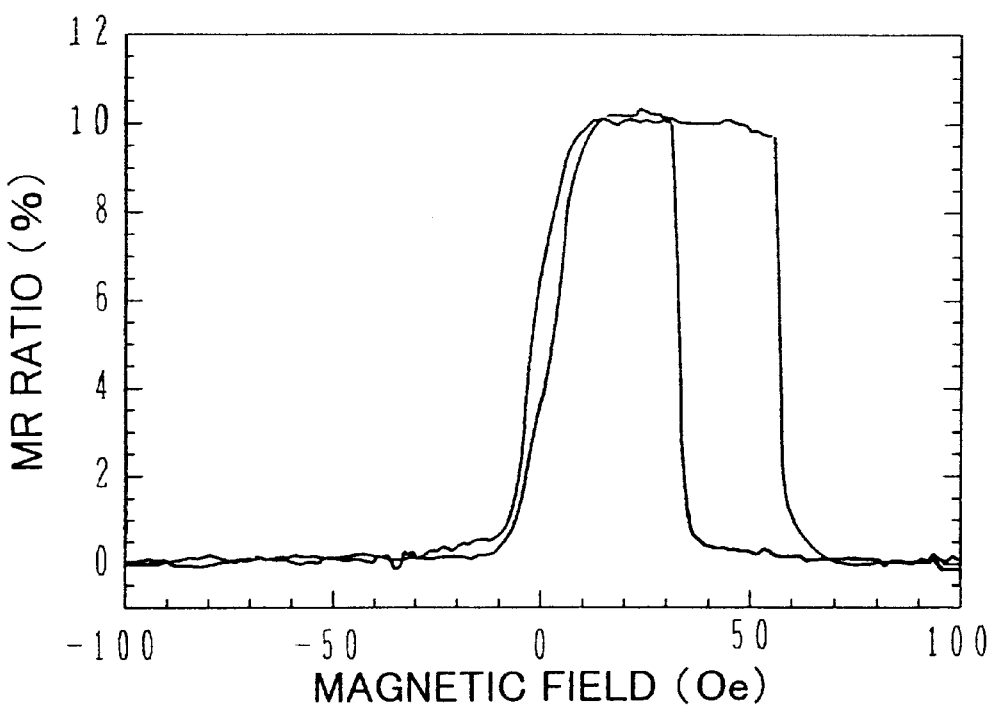
FIG. 2 is a graph showing an external magnetic field dependency of an MR ratio of the ferromagnetic tunnel junction structure shown in FIGS. 1A and 1B.

FIG. 2 is a graph showing a magnetic field dependency of a tunnel resistance change rate (MR ratio) of the ferromagnetic tunnel junction structure shown in FIGS. 1A and 1B. The abscissa represents an external magnetic field in the unit of Oe, and the ordinate represents an MR ratio in the unit of %. Two curves appear because an MR ratio changes differently in one way of a magnetic field change from −100 Oe to +100 Oe and in another way of a magnetic field change from +100 Oe −100 Oe. A magnetic field is applied along the direction perpendicular to the drawing sheet of FIG. 1B to rotate the magnetization direction of the lower NiFe layer 11 and lower Co layer 12 and make it parallel or reverse-parallel to the magnetization direction of the upper Co layer 31. If both the magnetization directions are parallel, the tunnel resistance becomes minimum, whereas if they are reverse-parallel, it becomes maximum. The MR ratio is defined by:

$$\text{MR ratio} = (\rho_{max} - \rho_{min})/\rho_{min} \quad (4)$$

where $\rho_{max}$ and $\rho_{min}$ are a maximum tunnel resistance and a minimum tunnel resistance, respectively.

As shown in FIG. 2, an MR ratio of about 10% is obtained at a magnetic field of about 20 Oe.

Next, a change in the MR ratio of the ferromagnetic tunnel junction structure shown in FIGS. 1A and 1B after a heat treatment for one hour in a vacuum at a pressure of $1 \times 10^{-5}$ Torr, will be described.

Figure 3:
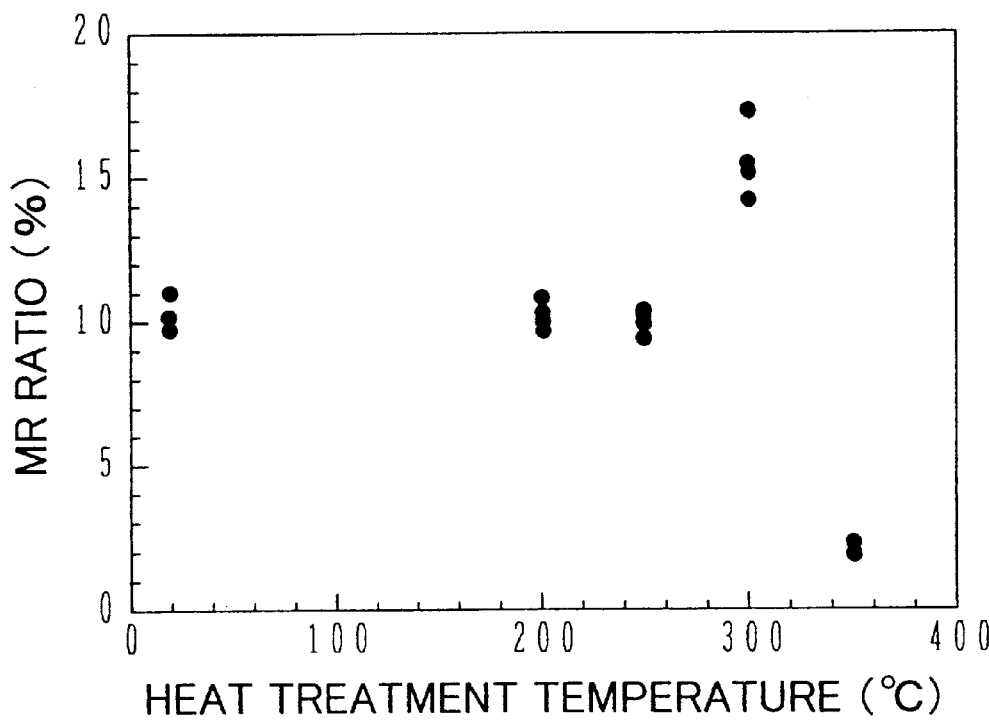
FIG. 3 is a graph showing a heat treatment temperature dependency of an MR ratio of the ferromagnetic tunnel junction structure shown in FIGS. 1A and 1B.

FIG. 3 is a graph showing a heat treatment dependency of the MR ratio after heat treatment. The abscissa represents a heat treatment temperature in the unit of ° C. and the ordinate represents an MR ratio in the unit of %. Even if a heat treatment is performed at a temperature of 200 to 300° C., the MR ratio lowers hardly. This may be ascribed to the CoO layer 13 shown in FIG. 1B which functions as a diffusion preventing layer to prevent mutual diffusion of Co and Al in the lower Co layer 12 and Al layer 21 and prevent the formation of solid solution of Al and Co.

An increase in the MR ratio by a heat treatment at a temperature of 300° C. may be ascribed to that oxygen atoms in the CoO layer 13 diffuse into the Al layer 21 and form an AlO layer which extinguishes the non-magnetic Al layer 21 or makes this layer thin. In order to ensure such effects, it is preferable to select material of each layer so that a binding energy between each metal element (in this case, Al) constituting the intermediate layer 20 becomes larger than a binding energy of each metal element (in this case, Co) constituting a layer (in this case, Co layer 12) in the lower magnetic layer 10 on the side of the intermediate layer 20.

In this embodiment, a Co oxide film is used as the diffusion preventing layer, and an Al oxide film is used as the tunnel insulating layer. The diffusion preventing layer and tunnel insulating layer may be formed by reacting Co and Al with other elements different from oxygen if these elements can react with Co and Al and form insulating material. For example, nitride of Co and Al may be used.

Figure 4:
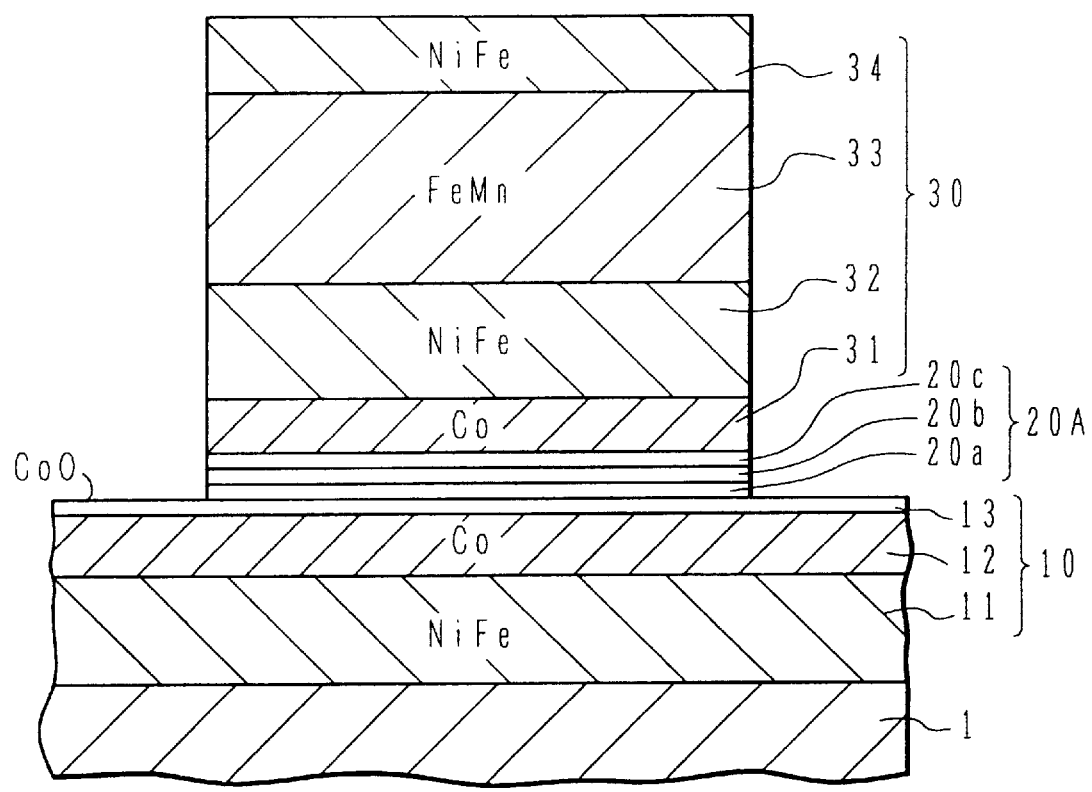
FIG. 4 is a cross sectional view of a ferromagnetic tunnel junction structure according to a first modification of the embodiment of the invention.

FIG. 4 is a cross sectional view of a ferromagnetic tunnel junction structure according to a first modification of the embodiment. In the ferromagnetic tunnel junction structure shown in FIG. 1B, the tunnel insulating layer 22 is formed through natural oxidation of an Al layer. However, it is difficult to oxidize an Al layer over the whole thickness, and an unoxidized Al layer 21 may be left in the deepest region of the Al layer.

In this first modification, deposition and natural oxidation of an Al layer are performed a plurality of times. Therefore, the intermediate layer 20A is formed of a plurality of AlO thin layers 20a to 20c. For example, the thickness of each Al thin layer 20a to 20c is set to 0.4 nm. The other structures are the same as the embodiment shown in FIGS. 1A and 1B.

Since the tunnel insulating film 20A is formed by a plurality of processes, the thickness of an Al layer to be oxidized by one oxidation process is thin. Therefore, the Al layer can be oxidized over the whole thickness relatively easily. The tunnel insulating layer 10A is not limited to be constituted of three layers, but it may be constituted of two layers, or four or more layers.

A non-magnetic Al layer is not left between the lower magnetic layer 10 and upper magnetic layer 30, or even if it is left, the left Al layer is very thin. A large MR ratio can therefore be expected. Each layer constituting the intermediate layer 20A may be formed by oxide of a different metal element. For example, the thin layers 20a and 20c may be formed by AlO and the thin layer 20b may be formed by NbO.

Figure 5:
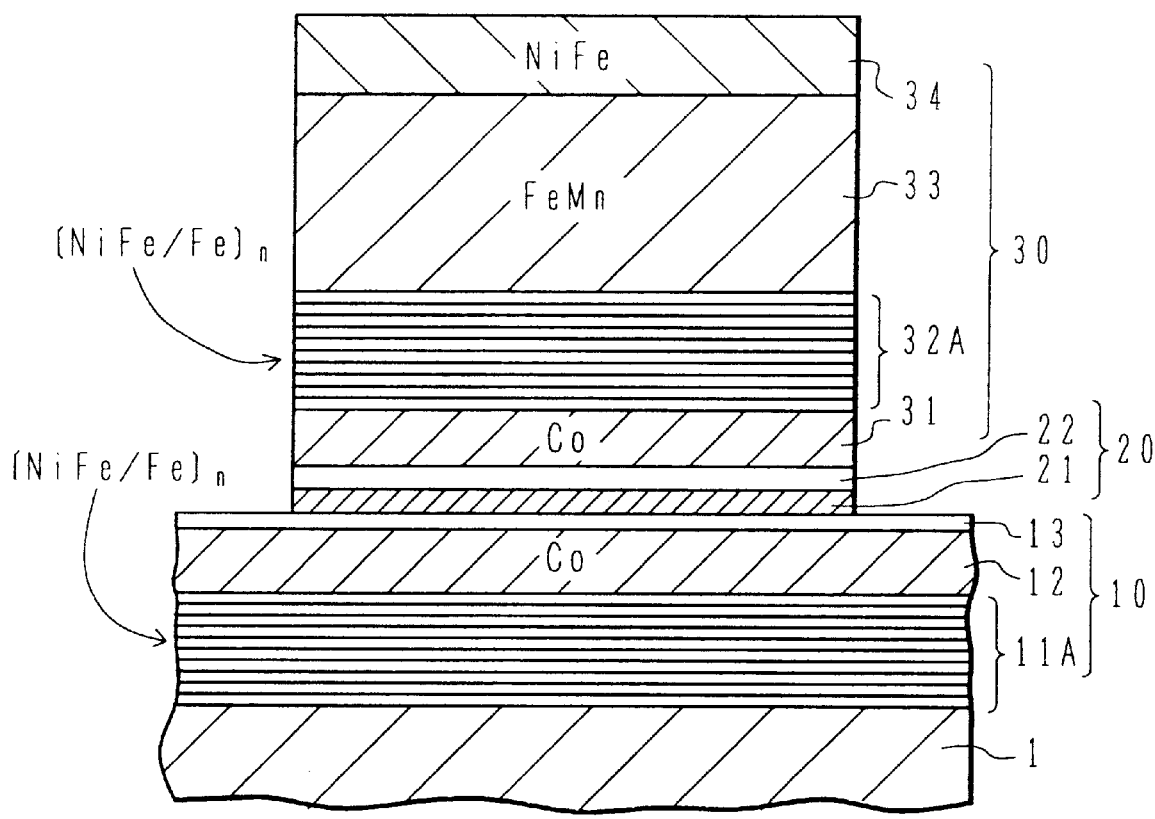
FIG. 5 is a cross sectional view of a ferromagnetic tunnel junction structure according to a second modification of the embodiment of the invention.

FIG. 5 is a cross sectional view of a ferromagnetic tunnel junction structure according to a second modification of the embodiment. In the ferromagnetic tunnel junction structure of the second modification, the lower NiFe layer 11 and upper NiFe layer 32 shown in FIG. 1B are replaced by laminated structures 11A and 32A formed by alternately depositing a NiFe thin layer and a Fe thin layer. For example, a NiFe layer of 2 nm thick and a Fe layer of 2 nm thick are alternately laminated each five layers. The other structures are the same as the embodiment shown in FIGS. 1A and 1B.

Such a multi-layer structure suppresses the growth of grains during heat treatment. If grains are grown during heat treatment, the tunnel junction structure is broken in some cases. By suppressing the growth of grains, heat resistance can be improved.

Figure 6:
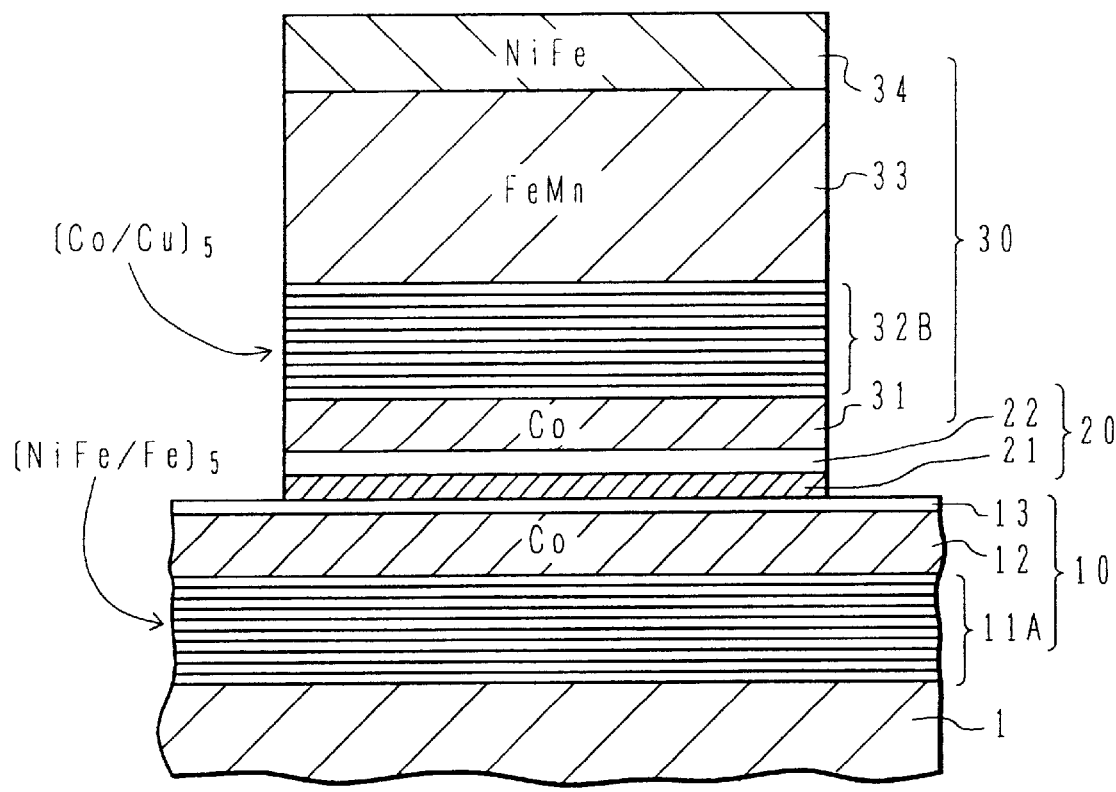
FIG. 6 is a cross sectional view of a ferromagnetic tunnel junction structure according to a third modification of the embodiment of the invention.

FIG. 6 is a cross sectional view of a ferromagnetic tunnel junction structure according to a third modification of the embodiment. In the ferromagnetic tunnel junction structure of the third modification, the lower NiFe layer 11 shown in FIG. 1B is replaced by a laminated structure 11A formed by alternately depositing a NiFe thin layer and a Fe thin layer similar to the second modification, and the upper NiFe layer 32 is replaced by a laminated structure 32B formed by alternately depositing a Co thin layer and a Cu thin layer. For example, a Co thin layer of 1.5 nm thick and a Cu thin layer of 1 nm thick are alternately laminated each five layers. The other structures are the same as the embodiment shown in FIGS. 1A and 1B.

If a multi-layer film is used, which is formed by alternately depositing a ferromagnetic thin layer and a non-magnetic thin layer, and if the thickness of the non-magnetic thin layer is adjusted, ferromagnetic or antiferromagnetic exchange interaction occurs between ferromagnetic thin layers which are then exchange-bound. In the third modification, antiferromagnetic exchange interaction occurs between Co thin layers. As this laminated structure 32B is made in contact with the antiferromagnetic FeMn layer 33, the magnetization direction in the ferromagnetic thin layers of the laminated structure 32B is fixed so that the same function of the embodiment shown in FIGS. 1A and 1B is obtained.

Ferromagnetic exchange interaction can also be realized by changing the thickness of the non-magnetic thin layer of the laminated structure. Also in this case, the magnetization direction of the laminated structure 32B is fixed and this structure serves as a magnetization fixed layer. The effects of suppressing the growth of grains explained with FIG. 5 can also be obtained.

Figure 7A:
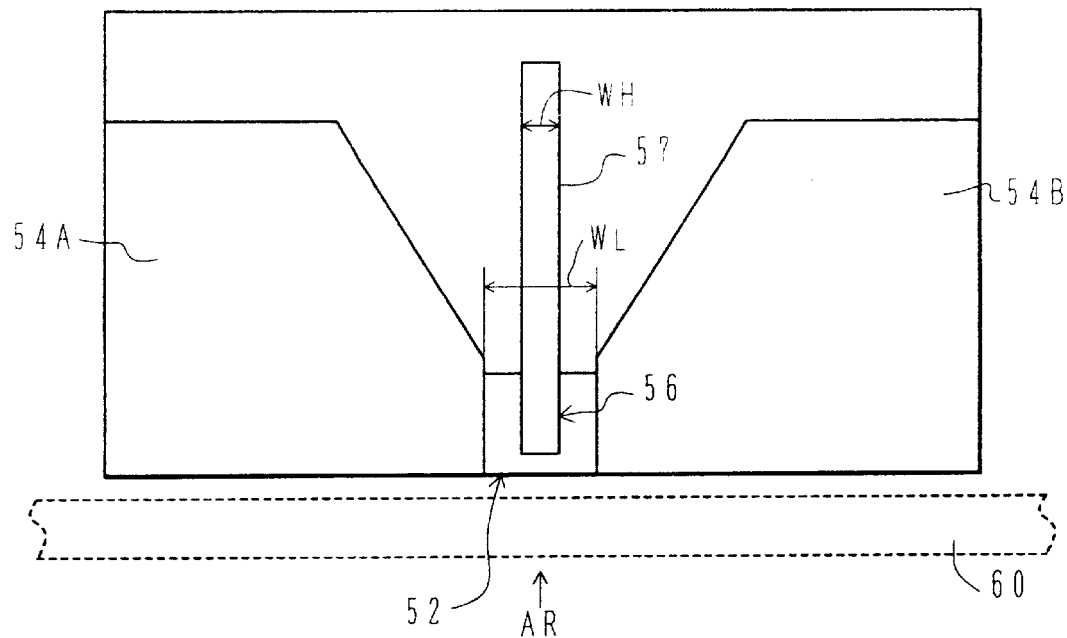
FIGS. 7A and 7B are respectively a top view and a front view of a magnetic head using the ferromagnetic tunnel junction structure of the embodiment or its modification.
Figure 7B:
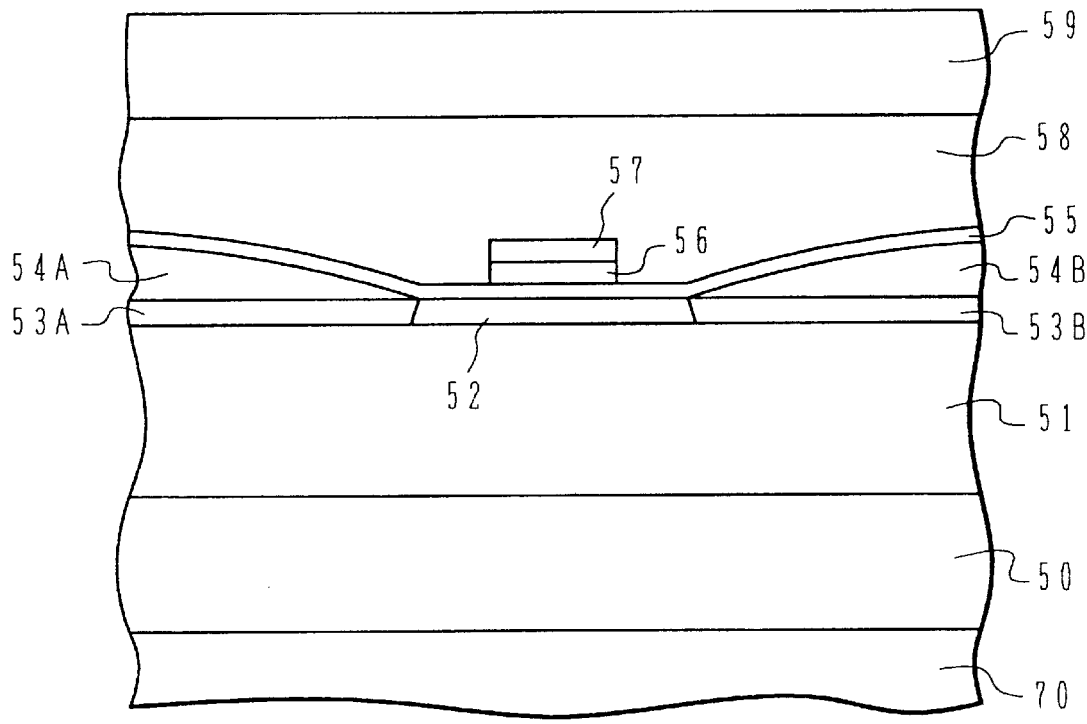

FIG. 7A is a top view of a magnetic head to be used with a hard disk drive, the magnetic head using the ferromagnetic tunnel junction structure of the embodiment or one of the first to third modifications. FIG. 7B is a front view (facing a magnetic disk) of the magnetic head shown in FIG. 7A as viewed along an arrow direction AR. With reference to FIGS. 7A and 7B, the structure and operation of this magnetic head will be described.

On a support substrate 70, a lower shield layer 50 made of NiFe, FeN or the like is formed. The support substrate 70 is made of a base substrate of $Al_2O_3$–TiC and an alumina ($Al_2O_3$) layer formed thereon. On the lower shield layer 50, a lower gap layer 51 made of $Al_2O_3$ is formed. A lower magnetic layer 52 is formed on a partial area of the lower gap layer 51. The width WL of the lower magnetic layer 52 is, for example, 0.8 μm. CoCrPt layers 53A and 53B are formed on both sides of the lower magnetic layer 52 and in contact with the side walls of this layer 52. The CoCrPt layers 53A and 53B are electrically connected to the lower magnetic layer 52.

On the CoCrPt layers 53A and 53B, electrodes 54A and 54B made of Ta, Ti, Cu, W or the like are formed. The electrodes 54A and 54B are electrically connected to the CoCrPt layers 53A and 53B, respectively. The CoCrPt layers 53A and 53B are magnetized so that the lower magnetic layer 52 has a single magnetic domain to suppress an abrupt change of domain walls and alleviate operation instability. An intermediate layer 55 is formed covering the lower magnetic layer 52 and electrodes 54A and 54B.

An upper magnetic layer 56 is formed on the intermediate layer 55 in an area corresponding to the lower magnetic layer 52. On the upper magnetic layer 56, an upper electrode 57 made of Ta, Ti, Cu, W or the like is formed. The width WH of the upper magnetic layer 56 is, for example, 0.5 $\mu$m. An upper gap layer 58 made of $Al_2O_3$ is formed covering the upper electrode 57 and intermediate layer 55. On the upper gap layer 58, an upper shield layer 59 made of NiFe or the like is formed.

The lower magnetic layer 52, intermediate layer 55 and upper magnetic layer 56 constitute a ferromagnetic tunnel junction structure. This ferromagnetic tunnel junction structure has the same as the ferromagnetic tunnel junction structure of the embodiment or one of the first to third modifications.

As shown in FIG. 7A, a magnetic disk 60 is positioned facing a facet shown in FIG. 7B. The magnetic disk 60 moves in a direction normal to the plane of the lower magnetic layer 52, with a gap to the facet shown in FIG. 7B being maintained. Depending upon a magnetized state of the magnetic disk 60, the magnitude and direction of the magnetic field generated in the lower magnetic layer 52 are changed.

The lower and upper shield layers 50 and 59 helps the magnetic head to pick up only a subject magnetization information among magnetization information recorded in the magnetic disk 60 and removes the influence to be caused by unnecessary nearby magnetic information. A distance between the upper and lower shield layers 50 and 59 defines a recording density of the magnetic disk 60 in the track direction (linear recording density).

In reading magnetization information, a constant current is flowed through the left side lower electrode 54A and upper electrode 57, and a voltage therebetween is detected. A constant current may be flowed through the right side lower electrode 54B and upper electrode 57, and a voltage between the left side lower electrode 54A and upper electrode 57 may be detected. This relation may be reversed.

In the above embodiment and modifications, Co and FeNi are used as ferromagnetic material, and FeMn is used as antiferromagnetic material. Other materials may also be used. Although insulating material with Al as its constituent element is used as the tunnel insulating film, other insulating materials with other metal elements as their constituent elements may also be used.

In the above embodiment, although the ferromagnetic tunnel junction having a laminated structure of magnetic layer/insulating layer/magnetic layer has been described, the invention is also applicable to a general tunnel junction having a laminated structure of metal layer/insulating layer/metal layer. By inserting a diffusion preventing layer between the metal layer and the insulating layer, it is possible to form solid solution at a high temperature and to improve heat resistance.

The present invention has been described in connection with the preferred embodiments. The invention is not limited only to the above embodiments. It is apparent that various modifications, improvements, combinations, and the like can be made by those skilled in the art.

What is claimed is:

1. A tunnel junction structure, comprising:
   a first magnetic layer formed over a support substrate;
   a tunnel insulating layer disposed over the first magnetic layer, the tunnel insulating layer containing a metal element as a constituent;
   a second magnetic layer disposed over the tunnel insulating layer; and
   a diffusion preventing layer disposed between the first magnetic layer and the tunnel insulating layer and made of material which suppresses mutual diffusion between metal atoms in the first magnetic layer and metal atoms in the tunnel insulating layer,
   wherein the tunnel insulating layer and the diffusion preventing layer each have a thickness allowing tunnel current to flow between the first and second magnetic layers.

2. A tunnel junction structure according to claim 1, further comprising a metal layer disposed between the diffusion preventing layer and the tunnel insulating layer, the metal layer containing a metal element constituting the tunnel insulating layer as a constituent.

3. A tunnel junction structure according to claim 2, wherein the diffusion preventing layer is an insulating layer formed by oxidizing a surface of the first magnetic layer.

4. A tunnel junction structure according to claim 1, wherein a binding energy between oxygen and a metal element constituting the tunnel insulating layer is larger than a binding energy of oxygen and metal elements constituting the first and second magnetic layers.

5. A tunnel junction structure according to claim 1, wherein the tunnel insulating layer has a laminated structure made of a plurality of insulating thin layers, adjacent two layers of the insulating thin layers constituting the laminated structure have different metal elements as constituents.

6. A tunnel junction structure according to claim 1, wherein one of the first and second magnetic layers is made of ferromagnetic material, and the other includes a first thin layer made of ferromagnetic material and disposed on the side near to the tunnel insulating layer and a second thin layer made of antiferromagnetic material and disposed adjacent to the first thin layer.

7. A tunnel junction structure according to claim 1, wherein at least one of the first and second magnetic layers is made of a lamination of a plurality of thin layers, and adjacent two thin layers are made of different magnetic materials.

8. A tunnel junction structure according to claim 1, wherein at least one of the first and second magnetic layers is a multi-layer film formed by alternately laminating a magnetic thin layer and a non-magnetic thin layer, wherein the magnetic thin layers mutually perform magnetic exchange interaction.

9. A method of manufacturing a tunnel junction structure, comprising the steps of:
   depositing a first magnetic layer on a surface of a base substrate;
   forming a diffusion preventing layer having a thickness sufficient for electrons to tunnel therethrough, by oxidizing or nitriding a surface of the first magnetic layer;
   depositing a metal layer on a surface of the diffusion preventing layer, the metal layer being made of metal which can be changed to insulating material through oxidization or nitridation;
   forming a tunnel insulating layer by oxidizing or nitriding at least a surface layer of the metal layer; and
   depositing a second magnetic layer on a surface of the tunnel insulating layer.

10. A method of manufacturing a tunnel junction structure according to claim 9, further comprising the step of performing a heat treatment at a temperature which allows oxygen or nitrogen atoms in the diffusion preventing layer to react with the metal layer and form a layer of oxide or nitride of a metal element constituting the metal layer, after the step of depositing the second magnetic layer.

11. A method of manufacturing a tunnel junction structure according to claim 9, wherein the step of depositing the metal layer and the step of forming the tunnel insulating layer are alternately performed a plurality of times.

12. A tunnel junction structure having a first metal layer, a tunnel insulating layer and a second metal layer laminated in this order, the tunnel junction structure comprising:

a diffusion preventing layer disposed between at least one of the first and second metal layers and the tunnel insulating layer, the diffusion preventing layer preventing mutual diffusion between metal atoms of the at-least-one of the first and second metal layers and atoms constituting the tunnel insulating layer.

13. A tunnel junction structure according to claim 12, wherein the tunnel insulating layer has a metal element as one constituent, and the diffusion preventing layer prevents formation of solid solution of the metal element in the tunnel insulating layer and the metal element of the at-least-one of the first and second metal layers.

14. A magnetic sensor comprising:

a first magnetic layer formed on a support substrate;

a tunnel insulating layer disposed on the first magnetic layer, the tunnel insulating layer containing a metal element as a constituent;

a second magnetic layer disposed on the tunnel insulating layer;

a diffusion preventing layer disposed between the first magnetic layer and the tunnel insulating layer and made of material which suppresses mutual diffusion between metal atoms in the first magnetic layer and metal atoms in the tunnel insulating layer; and detecting means for detecting a change in a tunnel resistance between the first and second magnetic layers, wherein the tunnel insulating layer and the diffusion preventing layer each have a thickness allowing tunnel current to flow between the first and second magnetic layers.

* * * * *